(12) United States Patent
Lee et al.

(10) Patent No.: US 8,767,468 B2
(45) Date of Patent: Jul. 1, 2014

(54) NONVOLATILE MEMORY DEVICE CAPABLE OF REDUCING READ DISTURBANCE AND READ METHOD THEREOF

(75) Inventors: Jae-il Lee, Yongin-si (KR); Moon Sone, Uiwang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 19 days.

(21) Appl. No.: 13/117,390

(22) Filed: May 27, 2011

(65) Prior Publication Data

US 2011/0292726 A1 Dec. 1, 2011

(30) Foreign Application Priority Data

Jun. 1, 2010 (KR) .......................... 10-2010-0051886

(51) Int. Cl.
*G11C 11/34* (2006.01)
(52) U.S. Cl.
USPC ............. 365/185.18; 365/189.15; 365/189.19
(58) Field of Classification Search
CPC ..... G11C 16/12; G11C 16/26; G11C 16/0483
USPC ........................................ 365/185.03, 185.18
See application file for complete search history.

(56) References Cited

U.S. PATENT DOCUMENTS

| 7,701,784 B2 * | 4/2010 | Maejima et al. ......... 365/189.09 |
| 7,898,864 B2 * | 3/2011 | Dong ....................... 365/185.19 |
| 2007/0206426 A1 | 9/2007 | Mokhlesi |
| 2009/0016110 A1 | 1/2009 | Choi et al. |
| 2010/0124119 A1 * | 5/2010 | Lee et al. ................. 365/185.18 |

FOREIGN PATENT DOCUMENTS

| JP | 2002133888 A | 5/2002 |
| JP | 2009528651 T | 8/2009 |
| KR | 20090005695 | 1/2009 |
| KR | 20090026117 A | 3/2009 |
| WO | WO-2007103038 A1 | 9/2007 |

* cited by examiner

*Primary Examiner* — Anthan Tran
(74) *Attorney, Agent, or Firm* — Harness, Dickey & Pierce, P.L.C.

(57) ABSTRACT

Provided are a nonvolatile memory device and a read method of the same. The read method applying one of a plurality of unselected read voltages to unselected wordlines adjacent to a selected word line. The voltage applied to the unselected word lines being based on which of a plurality of selected read voltages is applied to the selected wordline.

13 Claims, 13 Drawing Sheets

NONVOLATILE MEMORY DEVICE CAPABLE OF REDUCING READ DISTURBANCE AND READ METHOD THEREOF

CROSS-REFERENCE TO RELATED APPLICATIONS

This U.S. non-provisional patent application claims priority under 35 U.S.C. §119 to Korean Patent Application No. 10-2010-0051886, filed on Jun. 1, 2010, the entirety of which is hereby incorporated by reference.

BACKGROUND

1. Technical Field

Example embodiments herein relate to semiconductor memory devices and, more particularly, to a nonvolatile memory device and a read method thereof.

2. Description of Related Art

Semiconductor memory devices are a type of storage device that is fabricated using a semiconductor material such as silicon (Si), germanium (Ge), gallium arsenide (GaAs), and indium phospide (InP). Generally, semiconductor memory devices are categorized as volatile memory devices or nonvolatile memory devices.

Volatile memory devices lose their stored data if the power supplies of the volatile memory device are interrupted. Nonvolatile memory devices retain their stored data even if the power supplies of the nonvolatile memory devices are interrupted. Types or categories of volatile memory devices include dynamic RAMs (DRAMs), static RAMs (SRAMs), and synchronous DRAMs (SDRAMs). Types or categories of nonvolatile memory includes read only memories (ROMs), programmable ROMs (PROMs), electrically programmable ROMs (EPROMs), electrically erasable and programmable ROMs (EEPROMs), flash memory devices, phase-change RAMs (PRAMs), magnetic RAMs (MRAMs), resistive RAMs (RRAMs), and ferroelectric RAMs (FRAMs). Flash memory devices are classified or categorized into NOR-type flash memory devices and NAND-type flash memory devices.

As integration density of a flash memory device keeps increasing, a distance between wordlines may become shorter and shorter. Thus, coupling may occur between the word lines to cause malfunction. For example, during a read operation of a flash memory device, a read error may be caused by a difference in voltage between a selected wordline and an adjacent wordline.

SUMMARY

Embodiments of example embodiments of the inventive concepts provide a read method of a nonvolatile memory device.

In some example embodiments of the inventive concepts, the read method may include applying one of a plurality of selected read voltages to a selected wordline. The method may also include applying one of a plurality of unselected read voltages to unselected wordlines adjacent to the selected wordline based on which one of a plurality of selected read voltages is applied to the selected word line In other example embodiments of the inventive concepts, the read method may include applying one of a plurality of selected read voltages to a selected wordline. The method may also include applying one of a first and second unselected read voltages to a first unselected wordline adjacent to the selected wordline based on which one of a plurality of selected read voltages is applied to the selected wordline. The method may also include applying a third unselected read voltage to a second unselected wordline disposed between the first unselected wordline and a reference line.

Also, example embodiments of the inventive concepts provide a nonvolatile memory device.

In some example embodiments of the inventive concepts, the nonvolatile memory device may include a memory cell array connected to a reference line and a plurality of wordlines. The nonvolatile memory device may also include an address decoder configured to select one of the plurality of wordlines according to an input address. The memory device may also include a voltage generator configured to generate at least one of a first to third selected read voltages and at lest one of a first to third unselected read voltages The nonvolatile memory device may also include a control logic circuit configured, during a read voltage, to apply the first unselected read voltage to a first unselected wordline adjacent to the selected wordline if the first selected read voltage is applied to the selected wordline, apply the second unselected read voltage to the first unselected wordline when one of the second and third selected read voltages is applied to the selected wordline, and apply the third unselected read voltage to a second unselected wordline disposed between the reference line and the first unselected wordline.

BRIEF DESCRIPTION OF THE DRAWINGS

Example embodiments of the concepts will become more apparent in view of the attached drawings and accompanying detailed description. The example embodiments depicted therein are provided by way of example, not by way of limitation, wherein like reference numerals refer to the same or similar elements. The drawings are not necessarily to scale, emphasis instead being placed upon illustrating aspects of example embodiments of the inventive concepts.

DETAILED DESCRIPTION OF THE EMBODIMENTS

Figure 1:
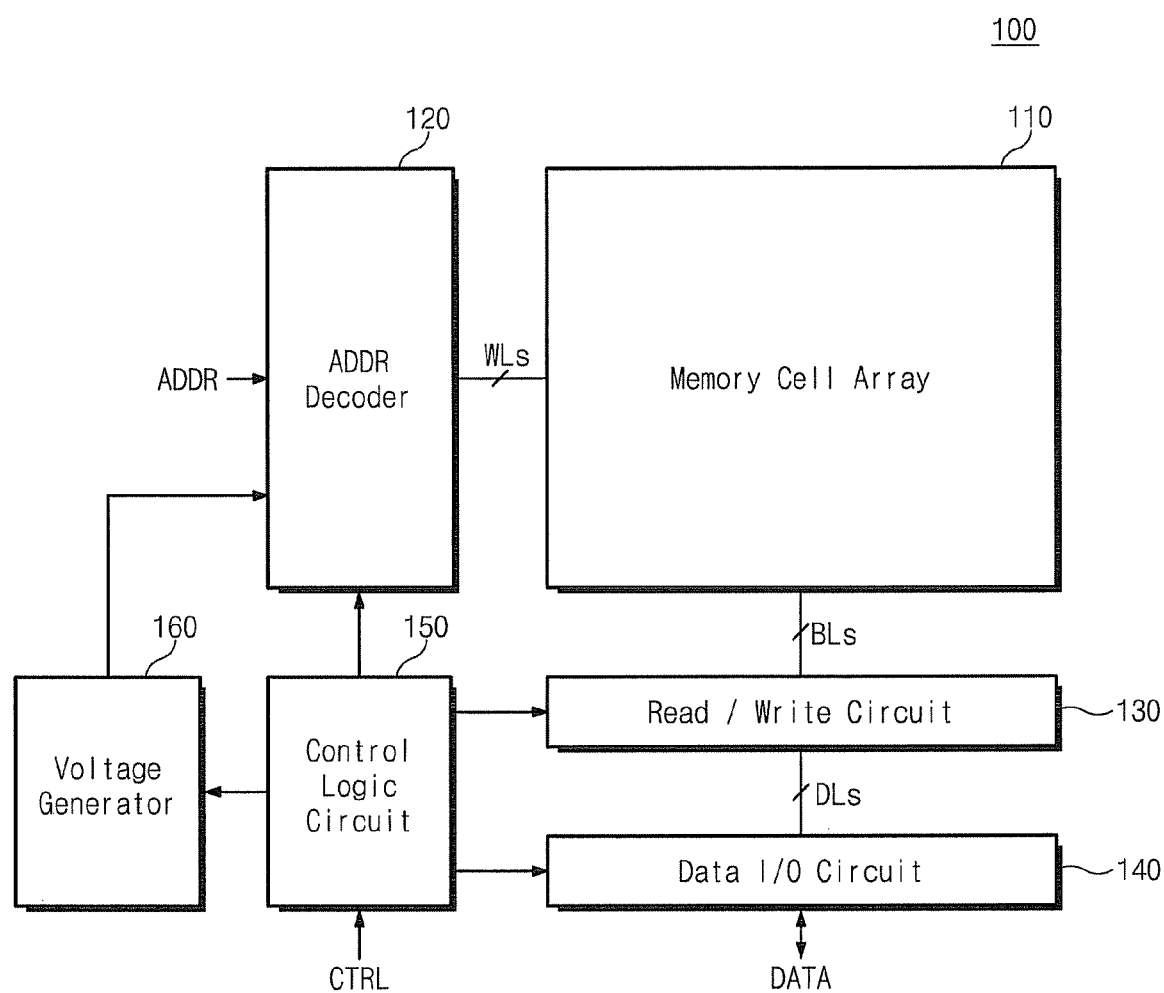
FIG. 1 is a block diagram of a flash memory device according to embodiments of the inventive concepts.

Example embodiments of the inventive concepts will now be described more fully hereinafter with reference to the accompanying drawings, in which preferred embodiments of the inventive concepts are shown. However, the inventive concepts may be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For brevity of description, embodiments of the inventive concepts will be described with reference to a flash memory device. However, the embodiments of the inventive concepts are not limited to a flash memory device and may be applied to nonvolatile memory devices such as ROM, PROM, EPROM, EEPROM, MRAM, PRAM, RRAM, and FRAM.

FIG. 1 is a block diagram of a flash memory device 100 according an example embodiment of the inventive concepts. As illustrated, the flash memory device 100 includes a memory cell array 110, an address decoder 120, a read/write circuit 130, a data input/output (I/O) circuit 140, a control logic circuit 150, and a voltage generator 160.

The memory cell array 110 is connected to the address decoder 120 through wordlines WLs and connected to the read/write circuit 130 through bitlines BLs. The memory cell array 110 includes a plurality of memory cells arranged in a matrix. Data is written and read at a memory cell corresponding to a wordline selected by the address decoder 120 and a bitline selected by the read/write circuit 130. The memory cell array 110 will be described in detail later with reference to FIG. 2.

According to embodiments of the inventive concepts, a plurality of memory cells may be implemented with a multi-level cell (hereinafter referred to as "MLC") that is capable of storing at least two bits of data. Assuming that two bits of data are stored in an MLC, a memory cell has one of four states (erased state and first to third programmed states) depending on a threshold voltage. Thus, during a read operation, a plurality of read voltages are desired or required to determine these states of a memory cell. During a program verify operation, a plurality of verify read voltages are desired or required to verify states of a programmed memory cell. This will be described in detail later with reference to FIGS. 3 to 6.

The address decoder 120 operates in response to the control of the control logic circuit 150. The address decoder 120 may include elements such as an address buffer, a row address decoder, and a column address decoder. The address decoder 120 externally receives addresses ADDR. The address decoder 120 decodes a row address and a column address from the externally received addresses ADDR. The address decoder 120 selects wordlines WLs according to the decoded row address. The address decoder 120 provides the decoded column address to the read/write circuit 130.

The address decoder 120 transfers wordline voltages, such as a selected read voltage, an unselected read voltage, and a verify read voltage, to a corresponding wordline.

The read/write circuit 130 is connected to the memory cell array 110 through the bitlines BLs and connected to the data I/O circuit 140 through data lines DLs. The read/write circuit 130 may include elements such as a page buffer and a column selection circuit. The read/write circuit 130 operates in response to the control of the control logic circuit 150. The read/write circuit 130 selects bitlines according to the decoded column address transferred from the address decoder 120.

In an example embodiment, the read/write circuit 130 writes data transferred from the data I/O circuit 140 through the data lines DLs into the memory cell array 110. In another example embodiment, the read/write circuit 130 transfers data read out of the memory cell array 110 to the data I/O circuit 140 through the data lines DLs. In yet another example embodiment, the read/write circuit 130 writes data read out of a first storage region of the memory cell array 110 into a second storage region of the memory cell array 120.

The data I/O circuit 140 is connected to the read/write circuit 130 through the data lines DLs. The data I/O circuit 140 may include an element such as a data buffer. The data I/O circuit 140 provides externally received data DATA to the read/write circuit 130. The data I/O circuit 140 transfers the data provided from the read/write circuit 130 to an external entity. The data I/O circuit 140 operates in response to the control of the control logic circuit 150.

The control logic circuit 150 is connected to the address decoder 120, the read/write circuit 130, the data I/O circuit 140, and the voltage generator 160. The control logic circuit 150 operates in response to an externally transferred control signal CTRL. The control logic circuit 150 controls main operations of the flash memory device 100. Particularly, during a read operation, the control logic circuit 150 controls the address decoder 120 such that corresponding wordlines are applied with wordline voltages generated at the voltage generator 160.

The voltage generator 160 generates wordlines voltages such as a plurality of selected read voltages, a plurality of unselected read voltages, and a plurality of verify read voltages. The plurality of verify read voltages are used for determining states of a memory cell in response to the control of the control logic circuit 150 during a read operation. In addition, the voltage generator 160 provides the above-mentioned voltages to the address decoder 120.

The flash memory device 100 according to embodiments of the inventive concepts is configured to apply a selected read voltage to a selected one of wordlines. The flash memory device 100 is configured to apply a unselected read voltage to wordlines that are adjacent to the selected wordline during a read operation. For example, unselected wordlines adjacent to the selected wordline are applied with a first unselected read voltage if a selected wordline is applied with a first selected read voltage that is lowest voltage among the selected read voltages. In addition, the unselected wordlines adjacent to the selected wordline are applied with a second unselected read voltage that is a higher voltage than the first unselected read voltage if the selected wordline is applied with one of second and third selected read voltages that are higher voltages than the first selected read voltage. At this point, unselected wordlines that are not adjacent to the selected wordline are applied with a third unselected read voltage that is a lower voltage than the first and second unselected read voltages.

As a result, a difference in voltage between a selected wordline and adjacent unselected wordlines may be maintained within a desired, required or predetermined range to reduce or limit charge loss caused by the difference in voltage therebetween during repeated read operations. That is, read disturbance resulting from increase of read stress is limited or suppressed.

Figure 2:
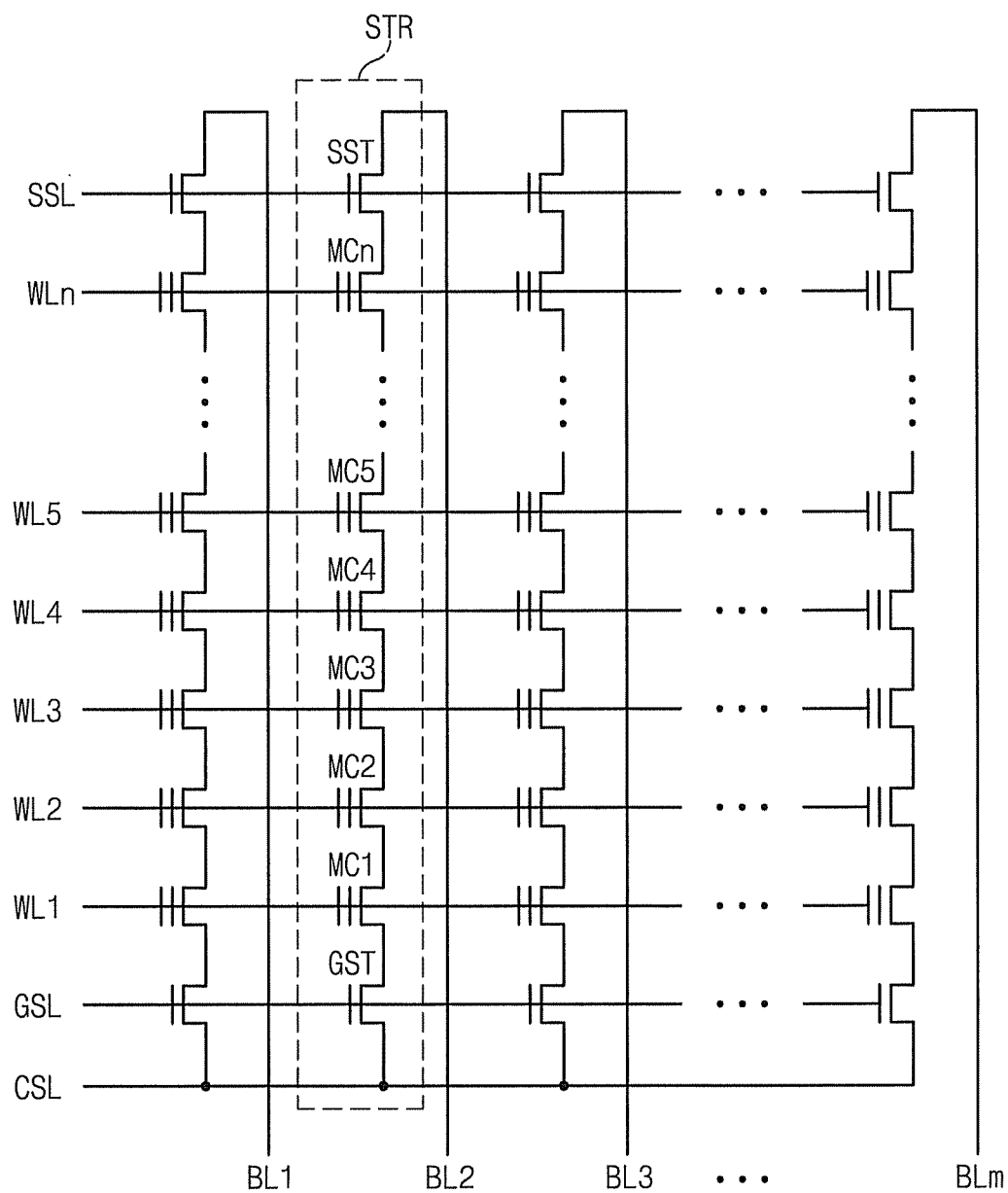
FIG. 2 is a circuit diagram of a memory cell array of the flash memory device illustrated in FIG. 1.

FIG. 2 is a circuit diagram of the memory cell array 110 shown in FIG. 1. For brevity of description, only one of a plurality of memory cells in the memory cell array 110 is shown.

Referring to FIG. 2, the memory cell array 110 includes a plurality of strings STR each comprising a string selection transistor SST, a ground selection transistor GST, and a plurality of memory cells MC1~MCn coupled between the string selection transistor SST and the ground selection transistor GST.

Sources/drains of the string selection transistors SST are connected to corresponding bitlines BL1~BLm. Gates of the string selection transistor SST are connected to a string selection line SSL. Sources/drains of the ground selection transistors GST are connected to a common source line CSL. Gates of the ground selection transistors GST are connected to a ground selection line GSL. Control gates of the memory cells MC1~MCn are connected to corresponding wordlines WL1~WLn.

During a read operation, a selected read voltage is transferred to a selected wordline and an unselected read voltage is transferred to the string selection line SSL, the ground selection line GSL, and unselected wordlines. Similarly, during a program verify operation, a selected verify read voltage is transferred to a selected wordline and an unselected verify read voltage is transferred to the string selection line SSL, the ground selection line GSL, and unselected wordlines.

According to embodiments of the inventive concepts, a plurality of memory cells MC1~MCn may be implemented with MLCs. For brevity of description, it is assumed that memory cells MC1~MCn according to an embodiment of the inventive concepts is implemented with an MLC storing two bits of data. In this case, one memory cell has one of four states (an erased state and first to third programmed states) depending on a threshold voltage. This embodiment of the inventive concepts will be described in detail later with reference to FIGS. 3 and 4.

In addition, it is assumed that memory cells MC1~MCn according to another example embodiment of the inventive concepts is implemented with an MLC storing three bits of data. In this case, one memory cell has one of eight states (an erased state and first to seventh programmed states) depending on a threshold voltage. This embodiment of the inventive concepts will be described in detail later with reference to FIGS. 5 and 6.

Figure 3:
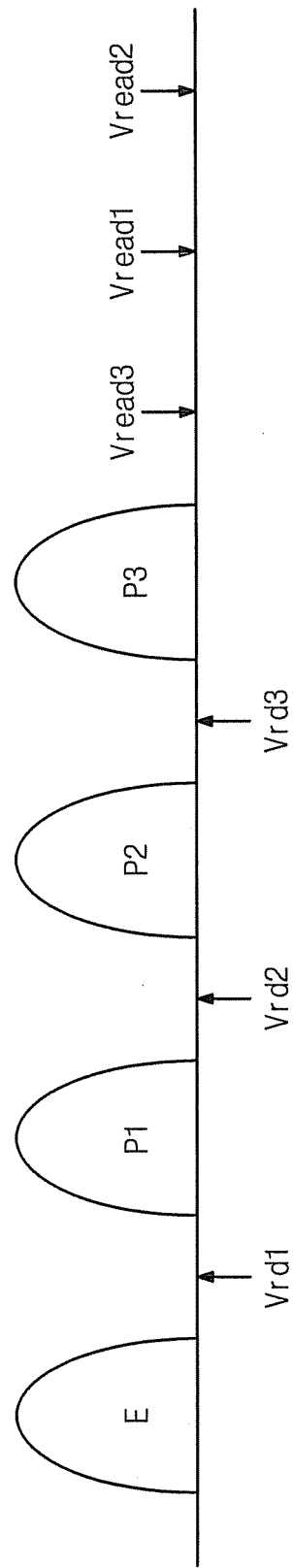
FIG. 3 shows threshold voltage distribution of memory cells according to an embodiment of the inventive concepts.

FIG. 3 illustrates threshold voltage distribution of memory cells according to an embodiment of the inventive concepts. Referring to FIG. 3, each of the memory cells has an erased state E and first to third programmed states P1~P3 depending on a threshold voltage. A threshold voltage of a memory cell having the first programmed state P1 is a higher voltage than that of a memory cell having the erased state E. A threshold voltage of a memory cell having the second programmed state P2 is a higher voltage than that of a memory cell having the first programmed state P1. A threshold voltage of a memory cell having the third programmed state P3 is a higher voltage than that of the memory cell having the second programmed state P2.

First to third selected read voltages Vrd1~Vrd3 and first to third unselected read voltages Vread1~Vread3 are used to determine a state of a memory cell connected to a selected wordline. During a read operation, a selected wordline is applied with one of the first to third selected read voltages Vrd1~Vrd3. The second selected read voltage Vrd2 is a higher voltage than the first selected read voltage Vrd1. The second selected read Vr2 voltage is a lower voltage than the third selected read voltage Vrd3. During a program verify operation, the first to third selected read voltages Vrd1~Vrd3 may be used as voltages for verifying states of a programmed memory cell.

During a read operation, according to a voltage applied to a selected wordline, one of the first and second unselected read voltages Vread1 and Vread2 is selected and applied to an unselected wordline adjacent to the selected wordline. In addition, the third unselected read voltage Vread3 is applied to an unselected wordline that is not adjacent to the selected wordline. The first to third unselected read voltages Vread1~Vread3 are higher than the third selected read voltage Vrd3. The second unselected read voltage Vread2 is higher than the first unselected read voltage Vread1. The first unselected read voltage Vread1 is a higher voltage than the third unselected read voltage Vread3.

Figure 4:
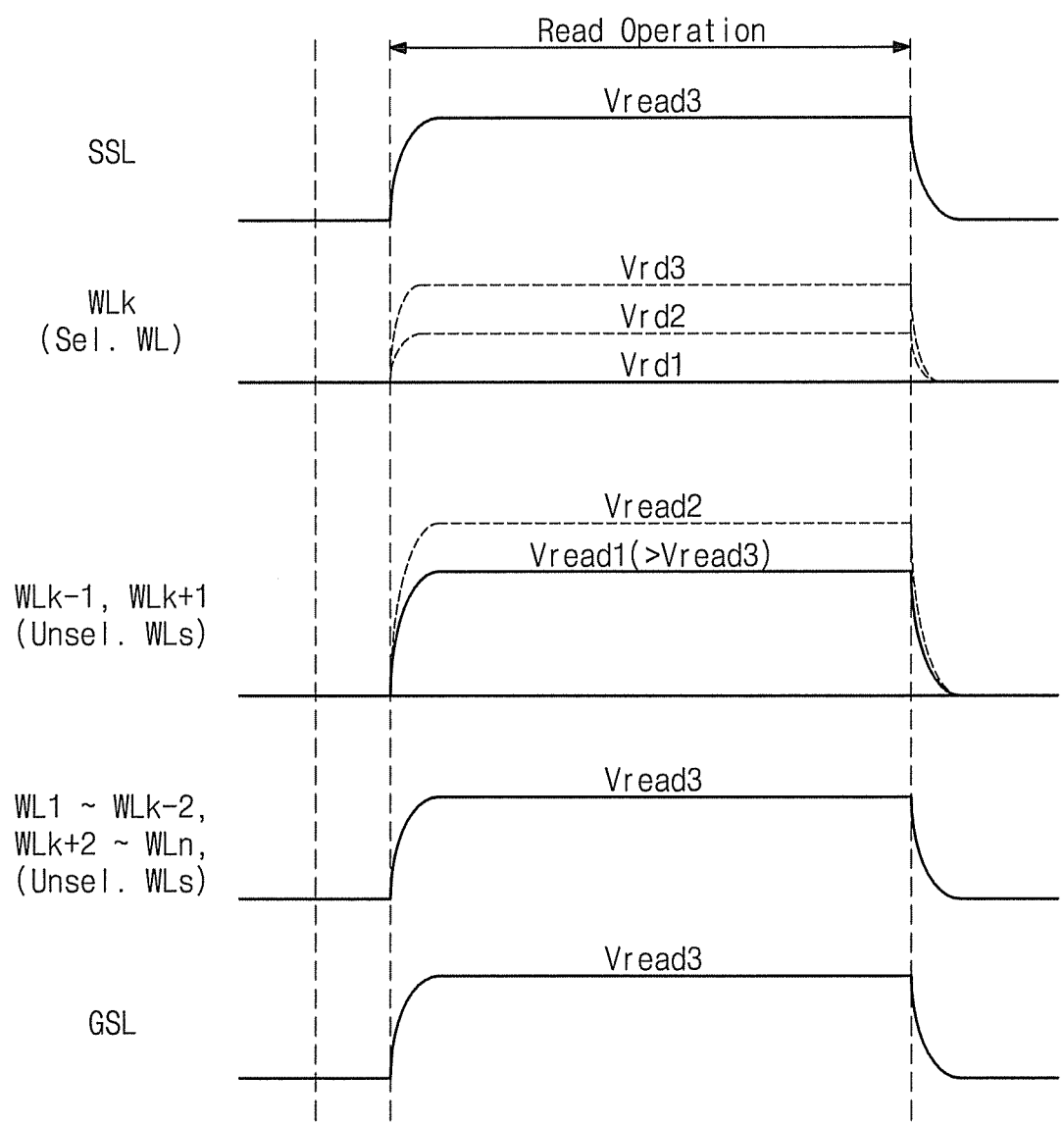
FIG. 4 is a timing diagram illustrating a read operation of a flash memory device according to the embodiment of FIG. 3.

FIG. 4 is a timing diagram illustrating a read operation of a flash memory device according to the embodiment of FIG. 3. For brevity of description, it is assumed that a kth wordline WLk is selected among a plurality of wordlines WL1~WLn.

Referring to FIGS. 3 and 4, during a read operation, unselected wordlines WLk−1 and WLk+1 adjacent to the wordline WLk are applied with the first unselected read voltage Vread1 if the selected wordline WLk is applied with the first selected read voltage Vrd1. The unselected wordlines WLk−1 and WLk+1 are applied with the second unselected read voltage Vread2 if the selected wordline WLk is applied with the second unselected read voltage Vrd2 or the third selected read voltage Vrd3. The string selection line SSL, the ground selection GSL, and unselected wordlines WL1~WLk−2 and WLk+2~WLn that are not adjacent to the selected wordline WLk are applied with the third unselected read voltage Vread3 if the selected wordline WLk is applied with one of the first to third selected read voltages Vrd1~Vrd3. The first unselected read voltage Vread1 is lower than the second selected read voltage Vread2 and the first unselected read voltage Vread1 is a higher voltage than the third selected read voltage Vrd3.

As a distance between wordlines becomes shorter and shorter, coupling may occurs between the selected wordline WLk and the adjacent unselected wordlines WLk−1 and WLk+1 during a read operation. The coupling results in decrease of an unselected read voltage applied to the unselected wordlines WLk−1 and WLk+1 that are adjacent to the selected wordline WLk. In order to limit or prevent the decrease of the unselected read voltage applied to the unselected wordlines WLK−1 and WLK+1, the unselected wordlines WLk−1 and WLk+1 adjacent to the selected wordline WLk are applied with a voltage, which is a higher voltage than an unselected read voltage applied to unselected wordlines WL1~WLk−2 and WLk+2~WLn that are not adjacent to the selected wordline WLk.

However, if a difference in voltage between the selected wordline WLk and the adjacent unselected wordlines WLk−1 and WLk+1 increases above a required, desired or predetermined value, charge loss may occur at memory cells connecting the unselected wordlines WLk−1 and WLk+1 during repeated read operations. Furthermore, the charge loss may become more severe if memory cells connected to the wordlines WLk−1 and WLk+1 have the third program state P3.

In the embodiment described in FIG. 3 suggests that during a read operation, the unselected wordlines WLk−1 and WLk1 adjacent to the selected wordline WLk are applied with the first unselected read voltage Vread1. The first unselected read voltage Vread1 is a voltage that is a lower voltage than the second unselected read voltage Vread2 and a higher voltage than the third unselected read voltage Vread3. The first unselected read voltage Vread1 being applied to the unselected wordlines WLk−1 and WLk1 adjacent to the selected wordline WLk if the selected wordline WLk is applied with the first selected read voltage Vrd1 that is the lowest voltage among the selected read voltages Vrd1~Vrd3. The unselected wordlines WLk−1 and WLk+1 adjacent to the selected wordline WLk are applied with the second unselected read voltage Vread2 if the selected wordline WLk is applied with the second and third selected read voltages Vrd2 and Vrd3 that are higher voltages than the first selected read voltage Vrd1.

As a result, the difference in voltages between the selected wordline WLk and the adjacent unselected wordlines WLk−1 and WLk+1 may be maintained within a required, desired or predetermined range to reduce charge loss caused by the difference in voltage therebetween during repeated read operations. That is, read disturbance resulting from increase of read stress is limited or suppressed.

Figure 5:
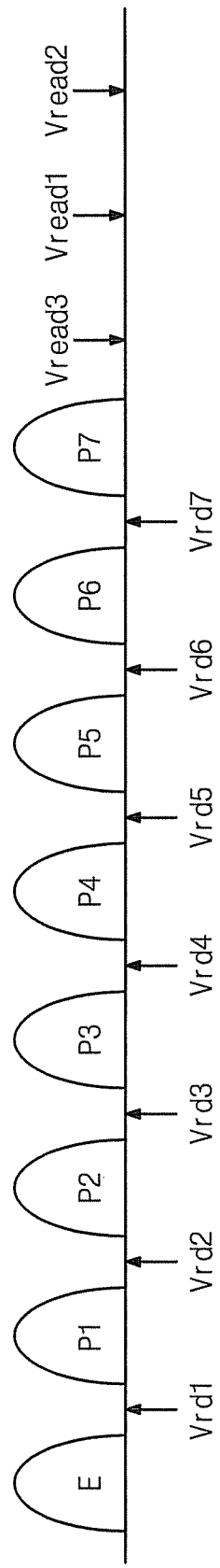
FIG. 5 shows threshold voltage distribution of memory cells according to another embodiment of the inventive concepts.

FIG. 5 shows threshold voltage distribution of memory cells according to another embodiment of the inventive concepts. Referring to FIG. 5, each of the memory cells has an erased state E and first to seventh programmed states P1~P7 depending on a threshold voltage.

First to seventh selected read voltages Vrd1~Vrd7 and first to third unselected read voltages Vread1~Vread3 are used to determine a state of a memory cell connected to a selected wordline. During a read operation, the selected wordline is applied with one of the first to seventh selected read voltages Vrd1~Vrd7. During a program verify operation, the first to seventh selected read voltages Vrd1~Vrd7 may be used as voltages for verifying states of a programmed memory cell.

During a read operation, according to a voltage applied to a selected wordline, one of the first and second unselected read voltages Vread1 and Vread2 is selected and applied to an unselected wordline adjacent to the selected wordline. In addition, the third unselected read voltage Vread3 is applied to an unselected wordline that is not adjacent to the selected wordline. The first to third unselected read voltages Vread1~Vread3 are higher voltages than the seventh selected read voltage Vrd3. The first unselected read voltage Vread1 is a lower voltage than the second unselected read voltage Vread2 and higher voltage than the third unselected read voltage Vread3.

Figure 6:
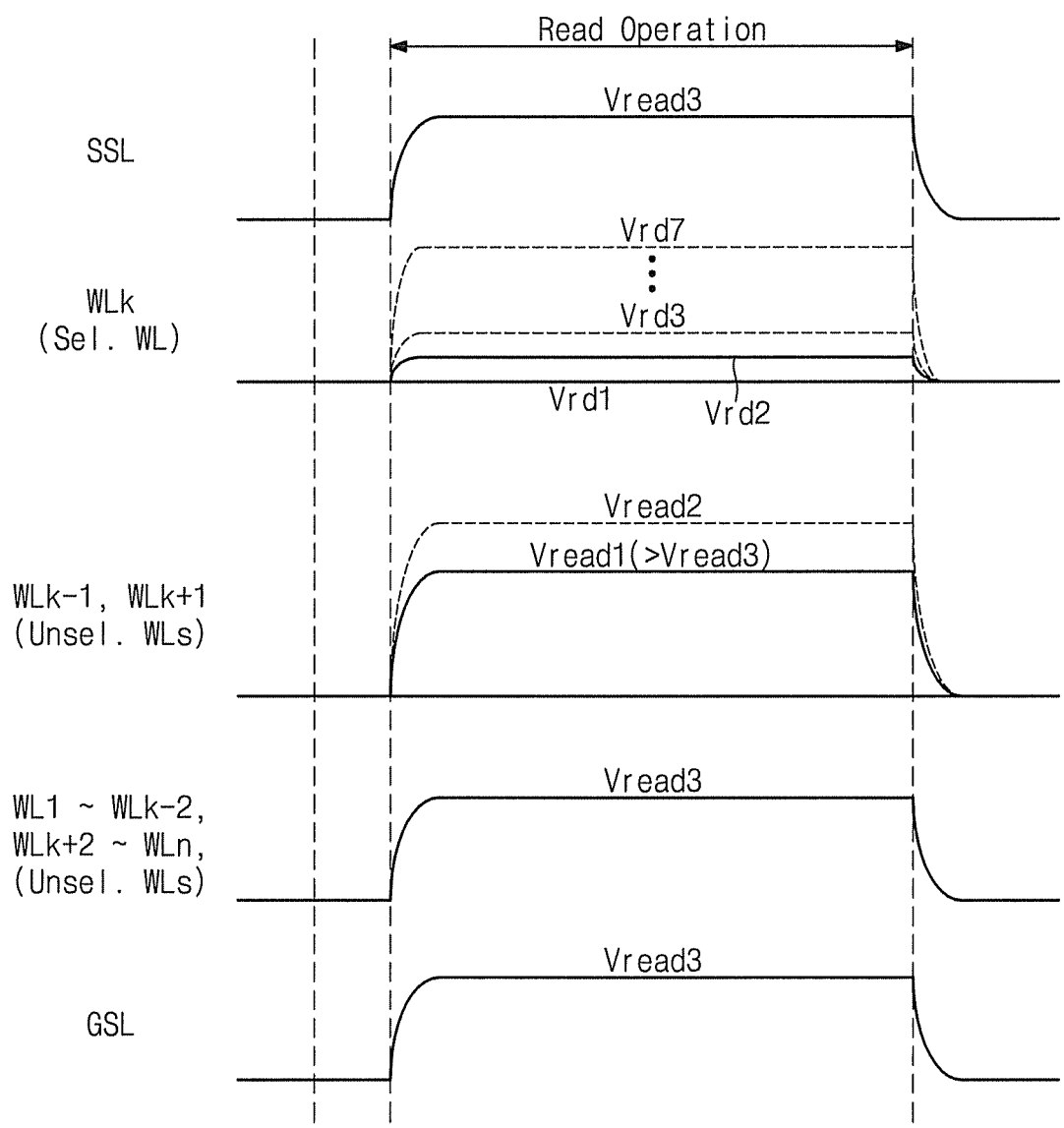
FIG. 6 is a timing diagram illustrating a read operation of a flash memory device according to the embodiment of FIG. 5.

FIG. 6 is a timing diagram illustrating a read operation of a flash memory device according to the embodiment of FIG. 5. For brevity of description, it is assumed that a kth wordline WLk is selected among a plurality of wordlines WL1~WLn.

Referring to FIGS. 5 and 6, during a read operation, unselected wordlines WLk−1 and WLk+1 adjacent to the selected wordline WLk are applied with a first unselected read voltage Vread1 if the selected wordline WLk is applied with one of the first and second selected read voltages Vrd1 and Vrd2. The unselected wordlines WLk−1 and WLk+1 adjacent to the selected wordline WLk are applied with a second unselected read voltage Vread2 if the selected wordline WLk is applied with one of the third to seventh selected read voltages Vrd3~Vrd7. A string selection line SSL, a ground selection line GSL, and unselected wordlines WL1~WLk−2 and WLk+2~WLn that are not adjacent to the selected wordline WLk are applied with a third unselected read voltage Vread3 if the selected wordline WLk is applied with one of the first to seventh selected read voltages Vrd1~Vrd7. The first unselected read voltage Vread1 is a lower voltage than the second unselected read voltage Vread2 and a higher voltage than the third unselected read voltage Vread3.

According to the embodiment described in FIG. 5, during a read operation, the unselected wordlines WLk−1 and WLk+1 adjacent to the selected wordline WLk are applied with the first unselected read voltage Vread1. The first unselected read voltage Vread1 is a lower voltage than the second unselected read voltage Vread2 and a higher voltage than the third unselected read voltage Vread3. The first unselected read voltage Vread1 is applied to the unselected wordlines WLk−1 and WLk+1 adjacent to the selected wordline WLk if the selected wordline WLk is applied with a voltage that is equal to or lower than a reference voltage, among the selected read voltage Vrd1~Vrd7. The unselected wordlines WLk−1 and WLk+1 adjacent to the selected wordline WLk are applied with the second unselected read voltage Vread2.

As a result, a difference in voltages between the selected wordline WLk and the adjacent unselected wordlines WLk−1 and WLk+1 may be maintained within a required, desired or predetermined range to reduce or limit charge loss caused by the difference in voltage therebetween during repeated read operations. That is, read disturbance resulting from repeated read stress is limited or suppressed.

Figure 7:
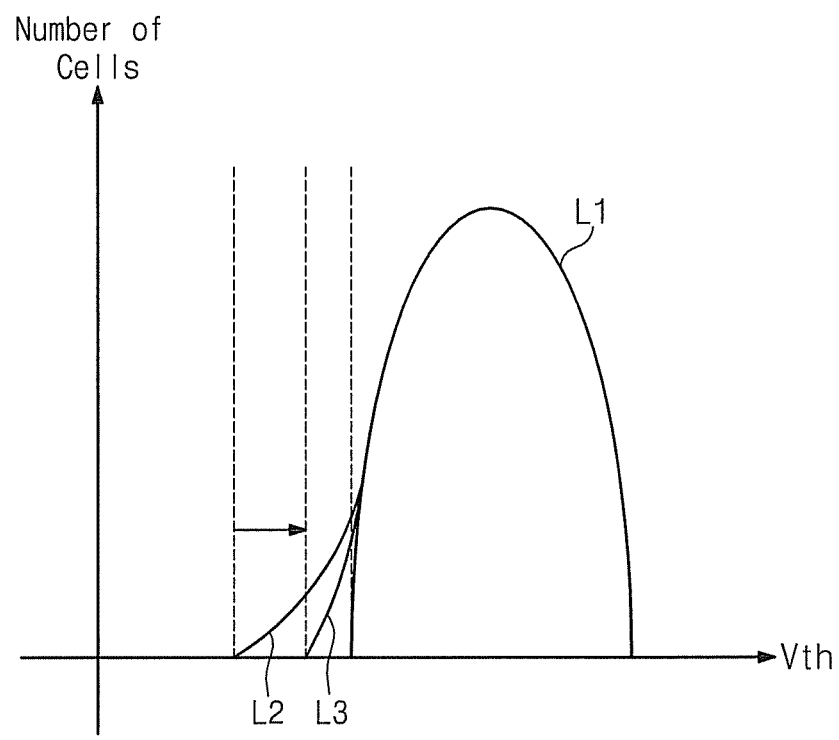
FIG. 7 shows distribution change of a threshold voltage to programmed memory cells.

FIG. 7 shows distribution change of a threshold voltage to programmed memory cells. Referring to FIG. 7, a first line L1 indicates the distribution of a threshold voltage to memory cells when a read stress is applied. A second line L2 indicates the distribution of a threshold voltage according to charge loss of memory cells connected to unselected wordlines adjacent to a selected wordline if a repeated read stress is applied. A third line L3 indicates the distribution of a threshold voltage according to reduction of charge loss caused by a repeated read stress.

According to the above-described flash memory device, during a read operation, one of a plurality of unselected wordlines is selected and applied to adjacent unselected wordlines according to a voltage applied to the selected wordline such that a difference in voltage between the selected wordline and the adjacent unselected wordlines is maintained within a required, desired or predetermined range during a read operation. Thus, the distribution of a threshold voltage is improved if a read operation is repeatedly performed in the flash memory device.

A flash memory device according to embodiments of the inventive concepts may be applied to various types of products. A flash memory device according to embodiments of the inventive concepts may be implemented with not only electronic devices such as a personal computer, a digital camera, a camcorder, a cell phone, an MP3 player, a portable multimedia player (PMP), a playstation portable (PSP), and a personal digital assistant (PDA) but also storage devices such as a memory card, a universal serial bus (USB) memory, and a solid state drive (hereinafter referred to as "SSD").

Figure 8:
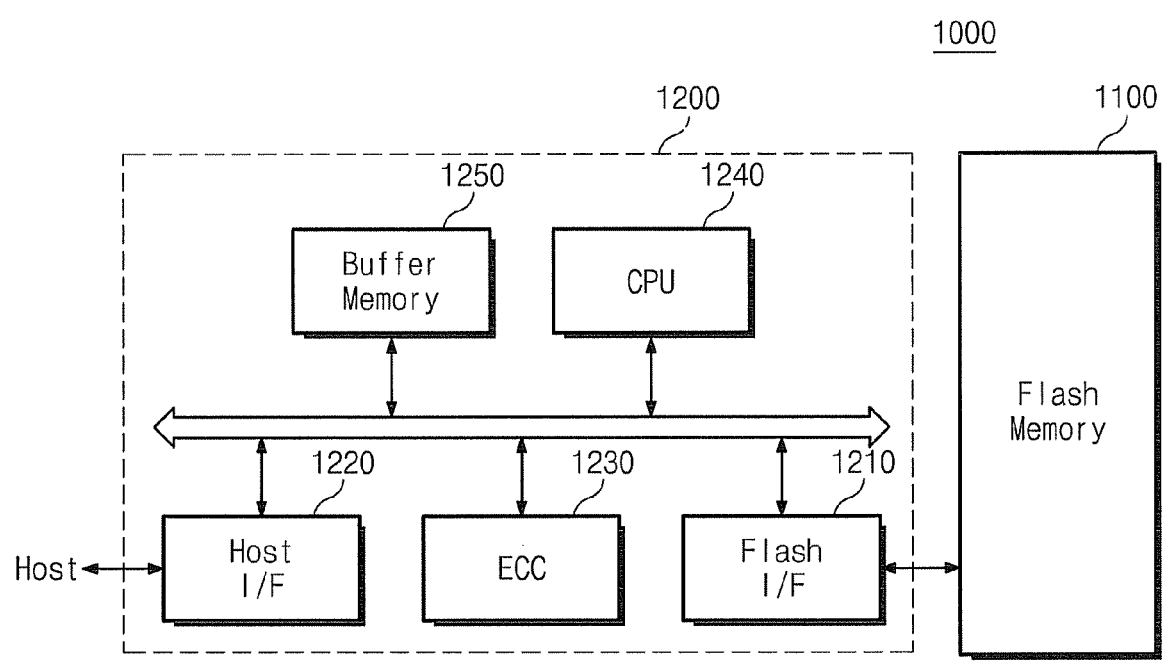
FIG. 8 is a block diagram of a memory system employing a flash memory device according to embodiments of the inventive concepts.

FIG. 8 is a block diagram of a memory system 1000 employing a flash memory device according to embodiments of the inventive concepts. As illustrated, the memory system 1000 includes a flash memory device 1100 and a memory controller 1200.

The flash memory device 1100 and the memory controller 1200 may be incorporated in one storage device. Such a storage device includes a portable storage device such as a USB memory and a memory card (MMC, SD card, xd card, CF card, SIM card, etc.) In addition, such a storage device may be connected to a host such as a computer, a notebook computer, a digital camera, a cell phone, an MP3 player, a PMP, and a game machine to be used therein.

The flash memory device 1100 may perform erase, write, and read operations in compliance with the control of the memory controller 1200. Particularly, during a read operation, the flash memory device 1100 selects one of a plurality of wordlines according to a voltage applied to a selected wordline and applies the selected wordline to adjacent unselected wordlines.

For example, wordlines adjacent to the selected wordline are applied with a first unselected read voltage if a selected wordline is applied with a first select read voltage that is the lowest voltage among selected read voltages. In addition, wordlines adjacent to the selected wordline are applied with a second unselected read voltage that is a higher voltage than the first unselected read voltage if the selected wordline is applied with one of second and third selected read voltages that are higher voltages than the first selected read voltage. Also, wordlines that are not adjacent to the selected wordline are applied with a third unselected read voltage that is a lower voltage than the first and second unselected read voltages.

The memory controller 1200 includes a flash interface (Flash I/F) 1210, a host interface (Host I/F) 1220, an ECC circuit 1230, a central processing unit (CPU) 1240, and a buffer memory 1250.

The flash interface 1210 is used to transmit and receives a command, an address, and data to and from the flash memory device 1100. That is, the flash interface 1210 provides a read command and an address during a read operation and provides a write command, an address, and data during a write operation. The host interface 1220 is used to receive a write or read request from a host or provide data in response to a request of the host.

The ECC circuit 1230 generates parity bit (or ECC data) using data transferred to the flash memory device 1100. The generated parity bit is stored in a spare area of the flash memory device 1100. The ECC circuit 1230 detects an error of data read out of the flash memory device 1100. If the detected error is within a correctable range, the ECC circuit 1230 corrects the detected error. According to the memory system 1000, the ECC circuit 1230 may be disposed inside or outside the memory controller 1200.

The CPU 1240 is configured to control a read or write operation of the flash memory device 1100 in response to the request of the host. The buffer memory 1250 may temporarily store data read out of the flash memory device 1100 or data provided from the host. Additionally, the buffer memory 1250 may be used to drive firmware such as a flash translation layer (FTL) which is operated by the CPU 1240. The buffer memory 1250 may be implemented with a DRAM, an SRAM or the like.

The buffer memory 1250 may store table information may store table information required for managing read error information. The table is meta data that is stored in a meta area of the flash memory device 1100 under the control of the CPU 1240. On power-up, the table information is copied from the meta area to the buffer memory 1250. Although not shown in the figure, the memory system 1000 may further include a read only memory (ROM) storing code data for interfacing with a host.

Figure 9:
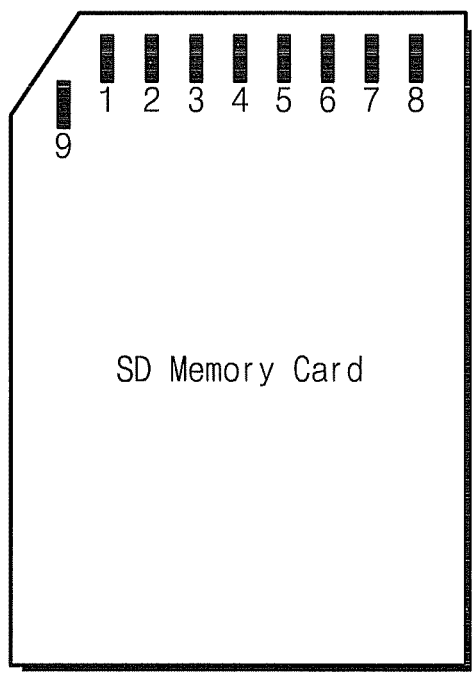
FIG. 9 is a block diagram of a memory card including a flash memory device according to embodiments of the inventive concepts.

FIG. 9 is a block diagram of a memory card including a flash memory device according to embodiments of the inventive concept. Specifically, FIG. 9 shows the appearance of an SD memory card among memory cards. As illustrated, the SD memory card has nine pins including four data pins (e.g., 1, 7, 8, and 9), one command pin (e.g., 2), one clock pin (e.g., 5), and three power pin (e.g., 3, 4, and 6).

A command and a response are transmitted through the command pin (e.g., 2). In general, the command is transmitted to a memory card from a host while the response is transmitted to the host from the memory card.

The memory system according to embodiments of the inventive concepts may be implemented with a portable storage device such as an SD card. The memory system 1000 may include a flash memory device 1100 and a memory controller 1200 configured to the flash memory device 1100.

The flash memory device 1100 may perform erase, write, and read operations in response to the control of the memory controller 1200. Particularly, the flash memory device 1100 is configured to select one of unselected wordlines according to a voltage applied to a selected wordline and apply the selected wordline to adjacent unselected wordlines during a read operation.

For example, according to the flash memory device 1100, wordlines adjacent to a selected wordline is applied with a first unselected read voltage if the selected wordline is applied with a first selected read voltage that is the lowest voltage among selected read voltages. In addition, the wordlines adjacent to the selected wordline are applied with a second unselected read voltage that is a higher voltage than the first unselected read voltage if the selected wordline is applied with one of second and third selected read voltages that are higher voltages than the first selected read voltage.

Figure 10:
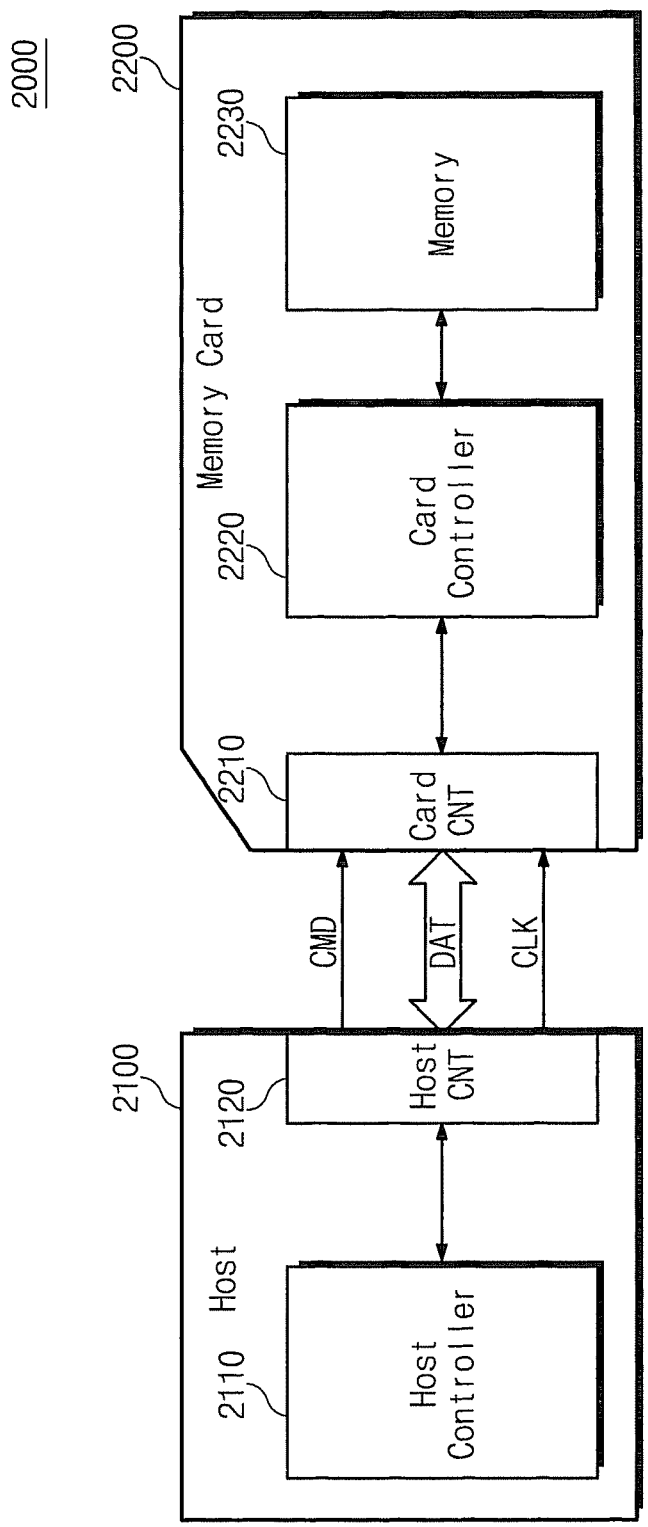
FIG. 10 is a block diagram illustrating an internal configuration of the memory card shown in FIG. 9 and a connection relationship between the memory card and a host.

FIG. 10 is a block diagram illustrating an internal configuration of the memory card shown in FIG. 9 and a connection relationship between the memory card and a host. A memory card system 2000 includes a host 2100 and a memory card 2200. The host 2100 includes a host controller 2110 and a host connection unit (Host CNT) 2120. The memory card 2200 includes a card connection unit (Card CNT) 2210, a card controller 2220, and a memory 2230.

Each of the host and card connection units 2120 and 2210 has a plurality of pins including a command pin, a data pin, a clock pin, a power pin, and so forth. The number of the pins varies with the type of memory card 2200. For example, an SD memory card has nine pins.

The host 2100 writes data into the memory card 2200 or reads data stored in the memory card 2200. The host controller 2110 transfers a command (e.g., write command), a clock signal CLK generated at a clock generator (not shown) in the host 2100, and data DAT to the memory card 2200 through the host connection unit 2120.

In response to a write command received through the card connection unit 2210, the card controller 2220 stores data in the memory 2230 in synchronization with a clock signal CLK generated at a clock generator (not shown) in the card controller 2220. The memory 2230 stored the data transferred from the host 2100. For example, if the host 2100 is a digital camera, it stores image data.

The memory system 1000 according to embodiments of the inventive concepts may be implemented with a memory card system 2000. The memory system 1000 includes a flash memory device 1100 and a memory controller 1200. The flash memory device 1100 may be implemented with a memory 2230, and the memory controller 1200 may be implemented with a card controller 2220.

The flash memory device 1100 may perform erase, write, and read operations according to the control of the memory controller 1200. Particularly, the flash memory device 1100 is configured to select one of a plurality of unselected one wordlines according to a voltage applied to a selected wordline. The flash memory device is also configured to apply an unselected read voltage to wordlines adjacent to the selected wordline during a read operation.

For example, wordlines adjacent to the selected wordline are applied with a first unselected read voltage if a selected wordline is applied with a first selected read voltage that is lowest voltage among selected read voltages. In addition, the wordlines adjacent to the selected wordline are applied with a second unselected read voltage that is a higher voltage than the first unselected read voltage if the selected wordline is applied with one of second and third selected read voltages that are higher voltages than the first selected read voltage. Wordlines that are not adjacent to the selected wordline are applied with a third unselected read voltage that is a lower voltage than the first and second unselected read voltages.

Figure 11:
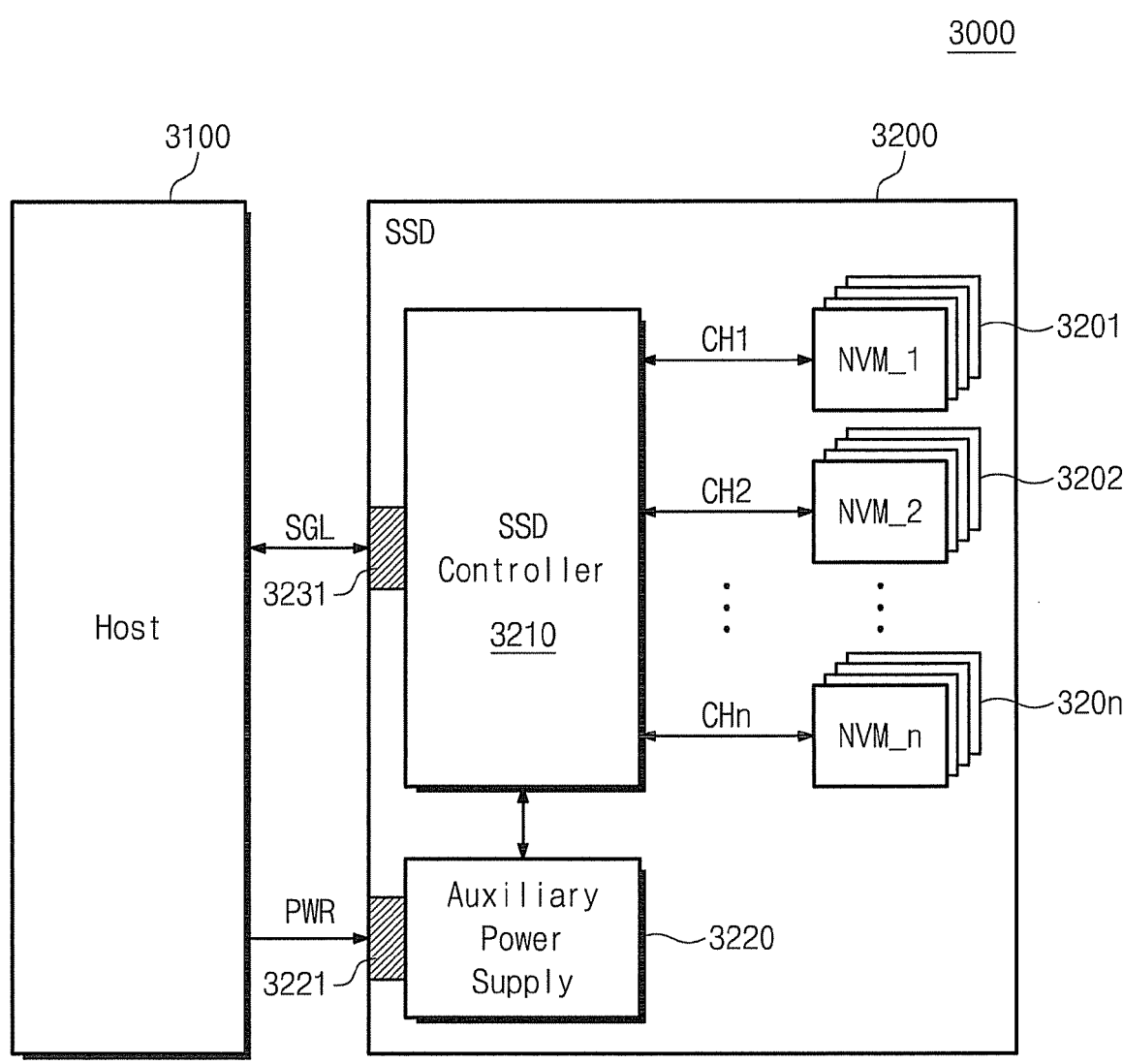
FIG. 11 is a block diagram illustrating an example of applying a flash memory device according to embodiments of the inventive concepts to a solid state drive (SSD).

FIG. 11 is a block diagram illustrating an example of applying a flash memory device according to embodiments of the inventive concepts to a solid state drive (SSD). Referring to FIG. 11, an SSD system 3000 includes a host 3100 and an SSD 3200. The SSD 3200 transfers/receives a signal to/from the host 3100 through a signal connector 3231 and receives a power through a power connector 3221. The SSD 3200 includes a plurality of memory devices 3201~320n, an SSD controller 3210, and an auxiliary power supply 3220.

The nonvolatile memory devices 3201~320n are used as a storage medium of the SSD 3200. The nonvolatile memory devices 3201~320n may be implemented with a flash memory device having large-capacity storage capability. The SSD 3200 uses a flash memory, but a nonvolatile memory device such as PRAM, MRAM, ReRAM or FRAM may be used as the SSD 3200.

The memory devices 3201~320n may be connected to the SSD controller 3210 through a plurality of channels CH1~CHn. One or more memory devices may be connected to one channel. The memory devices connected to the one channel may be connected to the same data bus.

The SSD controller 3210 transfers/receives a signal SGL to/from the host 3100 through the signal connector 3231. The signal SGL may include a command, an address, and data.

The SSD controller 3210 writes data into a corresponding memory device or reads data from a corresponding memory device according to the command of the host 3100. The internal configuration of the SSD controller 3210 will be described in detail below with reference to FIG. 10.

The auxiliary power supply 3220 is connected to the host 3100 through the power connector 3221. The auxiliary power supply 3220 may charge a power source PWR input from the host 3100. The auxiliary power supply 3220 may be disposed inside or outside the SSD 3200. For example, the auxiliary power supply 3220 may be disposed at a main board and supply an auxiliary power source to the SSD 3200.

The memory system 1000 according to embodiments of the inventive concepts may be implemented with an SSD system 300. The memory system 1000 may include a flash memory device 1100 and a memory controller 1200 configured to control the flash memory device 1100. The flash memory device 1100 may be implemented with a plurality of nonvolatile memory device 3201~320n, and the memory controller 1200 may be implemented with an SSD controller 3210.

The flash memory device 1100 may perform erase, write, and read operations according to the control of the memory controller 1200. Particularly, the flash memory device 1100 is configured to select one of a plurality of unselected one wordlines according to a voltage applied to a selected wordline and apply the unselected read voltage to an adjacent unselected wordline during a read operation.

For example, wordlines adjacent to the selected wordline are applied with a first unselected read voltage if a selected wordline is applied with a first selected read voltage that is the lowest voltage among selected read voltages. In addition, the wordlines adjacent to the selected wordline are applied with a second unselected read voltage that is a higher voltage than the first unselected read voltage if the selected wordline is applied with one of second and third selected read voltages that are higher than the first selected read voltage. Wordlines that are not adjacent to the selected wordline are applied with a third unselected read voltage that is a lower voltage than the first and second unselected read voltages.

Figure 12:
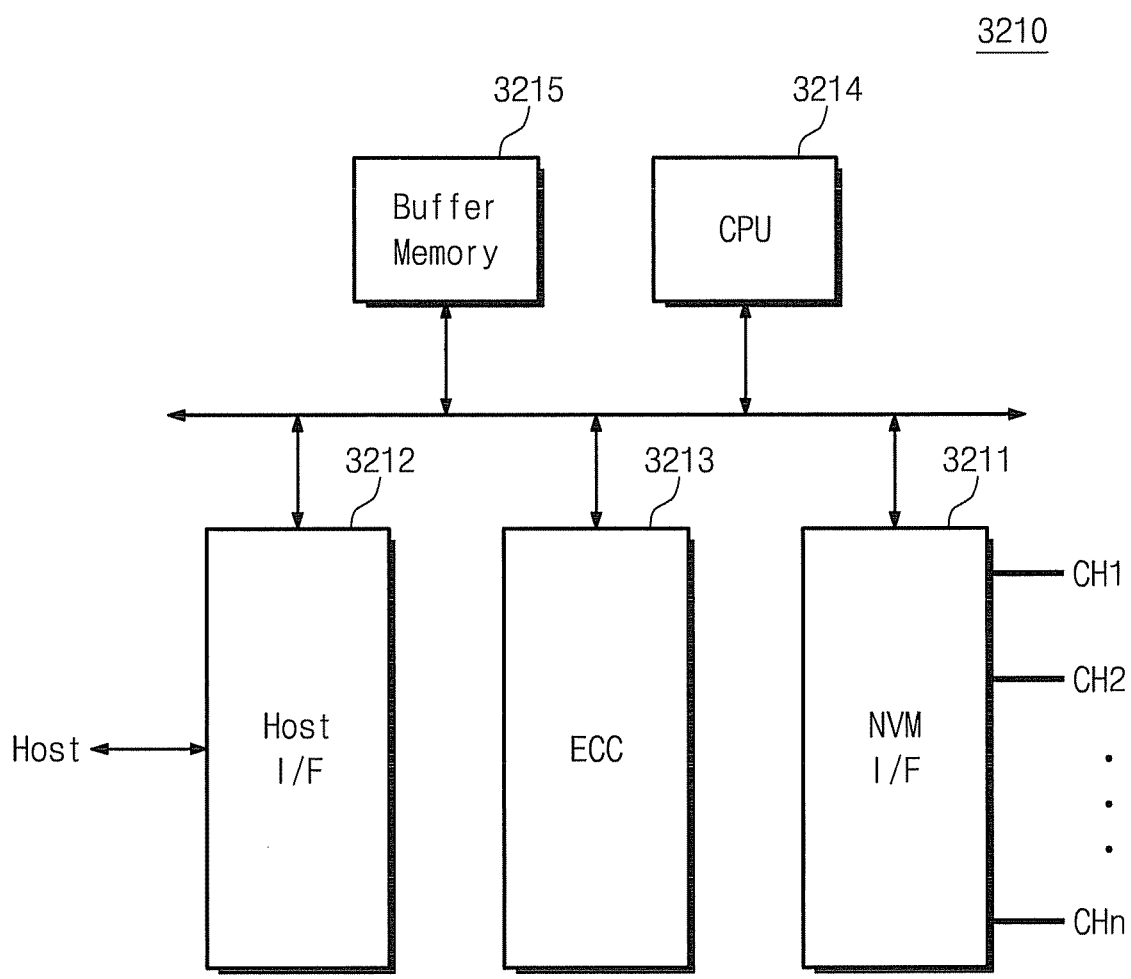
FIG. 12 is a block diagram of an exemplary configuration of an SSD controller shown in FIG. 11.

FIG. 12 is a block diagram of an exemplary configuration of the SSD controller 3210 shown in FIG. 11. As illustrated, the SSD controller 3210 includes a nonvolatile memory interface (NVM I/F) 3211, a host interface (Host I/F) 3212, an ECC circuit 3213, a central processing unit (CPU) 3214, and a buffer memory 3215.

The nonvolatile memory interface 3211 scatters data, which are transferred from the volatile memory 3215, to respective channels CH1~CHn. Furthermore, the nonvolatile memory interface 3211 transfers data, which are read out of nonvolatile memories 3201~320n, to the buffer memory 3215. The nonvolatile memory interface 3214 may use an interface scheme of a NAND flash memory. That is, the SSD controller 3210 may perform program, read, and erase operations according to the interface scheme of a NAND flash memory.

The host interface 3212 provides interfacing with the SSD 3200 according to the protocol of a host. The host interface 3212 may communicate with the host by using Universal Serial Bus (USB), Small Computer System Interface (SCSI), PCI express, ATA, Parallel ATA (PATA), Serial ATA (SATA) or Serial Attached SCSI (SAS). Moreover, the host interface 3212 may perform a disk emulation function to provide a support such that the host recognizes the SSD 3200 as a hard disk drive (HDD).

The ECC circuit 3213 generates parity bit (or ECC data) using data transferred to the nonvolatile memories 3201~320n. The generated parity bit is stored in spare areas of the nonvolatile memories 3201~320n. The ECC circuit 3213 detects an error of data read out of the nonvolatile memories 3201~320n. If the detected error is within a correctable range, the ECC circuit 3213 corrects the detected error.

The CPU 3214 analyzes and processes a signal SGL input from a host. The CPU 3214 controls the host or the nonvolatile memories 3201~320n through the host interface 3212 or the nonvolatile interface 3211. The CPU 3214 controls the operations of the nonvolatile memories 3201~320n according to firmware for driving the SSD 3200.

The buffer memory 3215 temporarily stores write data provided from the host or data read out of the nonvolatile memory. The buffer memory 3215 may store meta data or cache data to be stored in the nonvolatile memories 3201~320n. Upon a sudden power-off operation, the meta data or the cache data stored in the buffer memory 3215 is stored in the nonvolatile memories 3201~320n. The buffer memory 3215 may include a DRAM and an SRAM.

Figure 13:
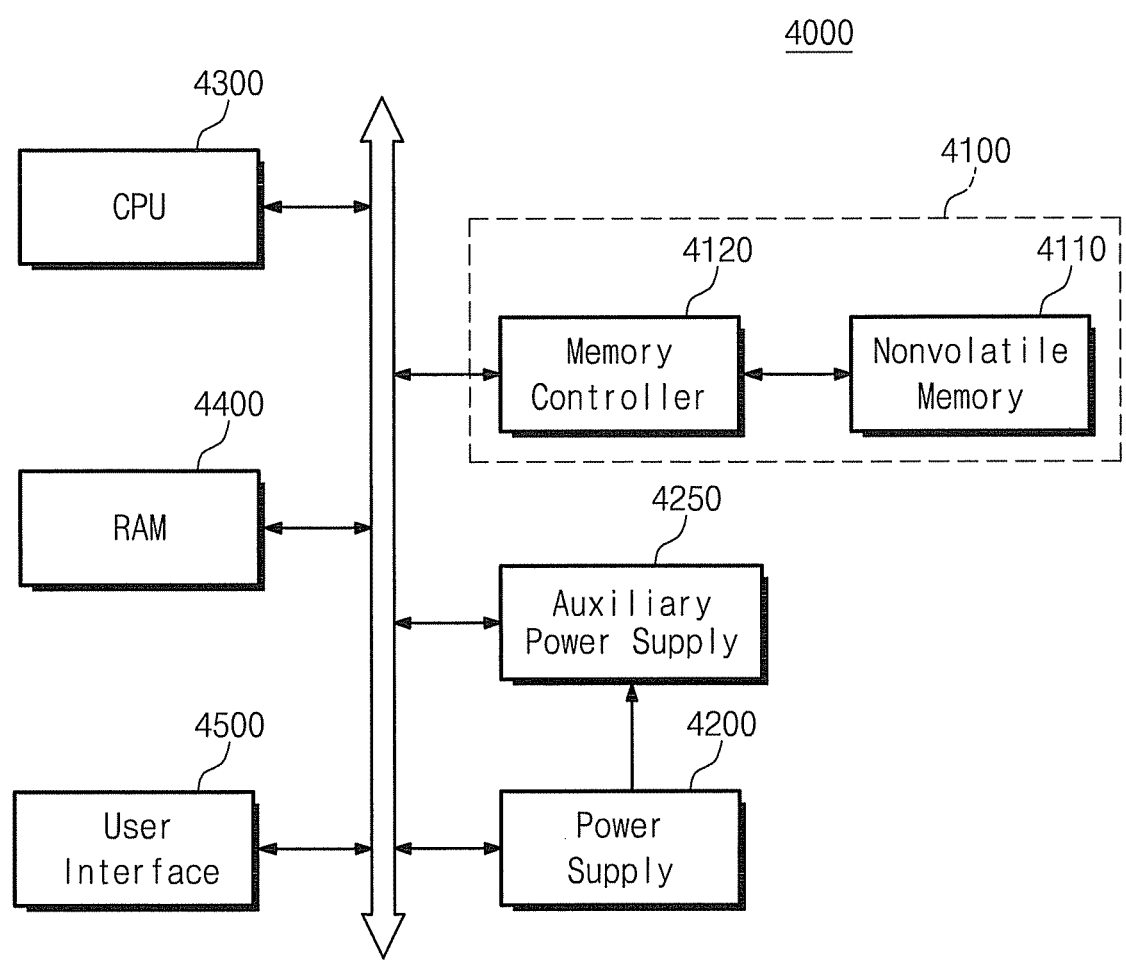
FIG. 13 is a block diagram illustrating an example of applying a flash memory device according to embodiments of the inventive concepts to an electronic device.

FIG. 13 is a block diagram illustrating an example of applying a flash memory device according to embodiments of the inventive concepts to an electronic device. The electronic device may be implemented with a personal computer (PC) or a portable electronic device such as a notebook computer, a cell phone, a personal digital assistant (PDA), and a camera.

Referring to FIG. 13, the electronic device 4000 includes a memory system 4100, a power supply 4200, an auxiliary power supply 4250, a central processing unit (CPU) 4300, a random access memory (RAM), and a user interface 4500. The memory system 4100 includes a flash memory 4110 and a memory controller 4120.

The memory system 1000 according to embodiments of the inventive concepts may be implemented with the memory system 4100 of the electronic device 4000. The memory system 1000 may include a flash memory device 1100 and a memory controller 1200 configured to control the flash memory 1100. The flash memory device 1100 may be implemented with the flash memory 4110 of the electronic device 4000, and the memory controller 1200 may be implemented with the memory controller 4120 of the electronic device 4000.

The flash memory device 1100 may perform erase, write, and read operations according to the control of the memory controller 1200. Particularly, the flash memory device 1100 is configured to select one of a plurality of unselected one wordlines according to a voltage applied to a selected wordline and apply the unselected read voltage to an adjacent unselected wordline during a read operation.

For example, wordlines adjacent to the selected wordline are applied with a first unselected read voltage if a selected wordline is applied with a first selected read voltage that is lowest, among selected read voltages. In addition, the wordlines adjacent to the selected wordline are applied with a second unselected read voltage that is a higher voltage than the first unselected read voltage if the selected wordline is applied with one of second and third selected read voltages that are higher voltages than the first selected read voltage. Wordlines that are not adjacent to the selected wordline are applied with a third unselected read voltage that is a lower voltage than the first and second unselected read voltages.

According to a nonvolatile memory device and a read method thereof described above, it is capable of reducing charge loss which occurs at a memory cell connected to a wordline adjacent to a selected wordline when repeated read stress is applied to the selected wordline. As a result, a read error resulting from the charge loss can be reduced.

While example embodiments of the inventive concepts have been described with reference to exemplary embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A read method of a nonvolatile memory device, comprising:
   applying one of a plurality of unselected read voltages to unselected wordlines adjacent to a selected wordline based on which one of a plurality of selected read voltages applied to the selected wordline,
   wherein the applying one of the plurality of unselected read voltages to the unselected wordlines adjacent to the selected wordline includes,
      applying a first unselected read voltage to wordlines adjacent to the selected wordline if a first selected read voltage is applied to the selected wordline;
      applying a second unselected read voltage to the wordlines adjacent to the selected wordline if a second selected read voltage is applied to the selected wordline, the second unselected read voltage being a higher voltage than the first unselected read voltage; and
      applying the second unselected read voltage to the wordlines adjacent to the selected wordline if a third selected read voltage is applied to the selected wordline,
      wherein the third selected read voltage is higher than the second selected read voltage.

2. The read method as set forth in claim 1, further comprising:
   applying a third unselected read voltage to unselected wordlines that are not adjacent to the selected wordline, the third unselected read voltage being a lower voltage than the first unselected read voltage.

3. The read method as set forth in claim 1, wherein the first selected read voltage is a lower voltage than the second selected read voltage.

4. The read method as set forth in claim 1, wherein at least one of the first to third selected read voltages are used as read voltages to verify a programmed result.

5. A read method of a nonvolatile memory device, comprising:
   applying one of first and second unselected read voltages to first unselected wordlines adjacent to a selected wordline based on which one of a plurality of selected read voltages is applied to the selected wordline; and
   applying a third unselected read voltage to a second unselected wordline disposed between the first unselected wordline and a base line, wherein
   the first unselected read voltage is applied to the first unselected wordlines if the one of the plurality of selected read voltages applied to the selected wordline is a first selected read voltage equal to or lower than a reference voltage, and the second unselected read voltage is applied to the first unselected wordlines if the one of the plurality of selected read voltages applied to the selected wordline is a second selected read voltage, the second unselected read voltage is applied to the first unselected wordlines if the one of the plurality of selected read voltages applied to the selected wordline is a third selected read voltage, the second and third selected read voltages are higher than the reference voltage, the second and third selected read voltages are different from each other, and the first unselected read voltage is a lower voltage than the second unselected read voltage and the first unselected read voltage is a higher voltage than the third unselected read voltage.

6. The read method as set forth in claim 5, wherein the plurality of selected read voltages have different magnitudes to determine states of memory cells connected to the selected wordline.

7. The read method as set forth in claim 6, wherein the memory cells have a plurality of programmed states by storing multi-bit data.

8. The read method as set forth in claim 5, wherein the plurality of selected read voltages are used as read voltages to verify a programmed result.

9. The read method as set forth in claim 5, further comprising:

applying the third unselected read voltage to the base line.

10. The read method as set forth in claim 5, wherein the base line is one of a ground selection line and a string selection line.

11. The read method as set forth in claim 5, wherein the nonvolatile memory device is a NAND-type flash memory device.

12. A read method of a non-volatile memory device, the method comprising:

supplying one of a first unselected read voltage and a second unselected read voltage to a first unselected word line that is adjacent to a selected wordline, the voltage of the first unselected read voltage and the second unselected read voltage being different from each other and based on a voltage supplied to the selected wordline;

supplying a third unselected read voltage to a second unselected word line, the second unselected word line being not adjacent to the selected wordline, the third unselected read voltage, and the third unselected read voltage being lower than the first and second unselected read voltages, wherein the voltage supplied to the selected wordline includes first, second, and third selected read voltages, the first unselected read voltage is supplied to the first unselected word line when the first selected read voltage is supplied to the selected wordline, the second unselected read voltage is applied to the first unselected word line when the second and third selected read voltages is supplied to the selected wordline, the second unselected read voltage is applied to the first unselected word line when the third selected read voltages is supplied to the selected wordline, the first and second unselected read voltages are different from each other, and the third and second selected read voltages are different from each other.

13. The read method of claim 12, wherein the first unselected read voltage is increased if the voltage supplied to the selected wordline is increased.

* * * * *